United States Patent
Chuah et al.

(10) Patent No.: US 7,471,163 B2
(45) Date of Patent: Dec. 30, 2008

(54) OXIDE OVERSTRESS TOLERANT CRYSTAL OSCILLATOR

(75) Inventors: Alan Eah Loon Chuah, Penang (MY); Syn Pui Law, Penang (MY)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 11/540,168

(22) Filed: Sep. 29, 2006
(Under 37 CFR 1.47)

(65) Prior Publication Data
US 2008/0079506 A1   Apr. 3, 2008

(51) Int. Cl.
*H03B 5/36* (2006.01)
(52) U.S. Cl. .................. 331/116 FE; 331/160; 331/109
(58) Field of Classification Search ................. 331/160, 331/158, 116 FE, 109, 185
See application file for complete search history.

(56) References Cited

U.S. PATENT DOCUMENTS 4,821,001 A * 4/1989 Hattori ........................ 331/158
5,208,558 A * 5/1993 Shigehara et al. ...... 331/116 FE

* cited by examiner

*Primary Examiner*—Joseph Chang
(74) *Attorney, Agent, or Firm*—Blakely, Sokoloff, Taylor & Zafman LLP

(57) ABSTRACT

An oscillator circuit includes a plurality of transistors that can withstand relatively low gate-to-source and gate-to-drain voltages. The oscillator circuit interfaces with an oscillator that oscillates at a relatively high voltage. The oscillator circuit includes a first set of transistors coupled to an input voltage and an output voltage of the oscillator, the input voltage oscillating in a range exceeding a tolerance voltage level of each transistor of the first set of transistors. The oscillator circuit also includes a second set of transistors to limit a voltage level in the first set of transistors. The oscillator circuit further includes a third set of transistors to provide a constant current path for the second set of transistors, independent of a switching state of each transistor of the first set of transistors.

19 Claims, 4 Drawing Sheets

US 7,471,163 B2

OXIDE OVERSTRESS TOLERANT CRYSTAL OSCILLATOR

BACKGROUND

1. Field

Circuit design for a crystal oscillator using low-voltage transistors.

2. Background

A current trend of microelectronics design is the reduction of device sizes. As the device sizes shrink, the thickness of gate oxide in these devices also shrinks. Thus, transistors fabricated by advanced processes (e.g., submicron processes) typically withstand lower gate-source (GS) or gate-drain (GD) voltages than conventional transistors. In a high voltage environment, these low-voltage transistors often suffer failures due to oxide-overstress. However, a low-voltage transistor may sometimes need to interface with high-voltage circuits. Signals received from the high-voltage interface may cause oxide overstress in the low-voltage transistors.

For example, in a network processor chip, an on-die oscillator circuit comprising low-voltage (e.g., 2.5 V) transistors may be connected to an off-die quartz crystal that operates at a high voltage (e.g., 3.3 V). The 3.3V signal input to the crystal oscillator circuit may overstress the gate oxide and damage the crystal oscillator circuit.

BRIEF DESCRIPTION OF THE DRAWINGS

Embodiments are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1A:
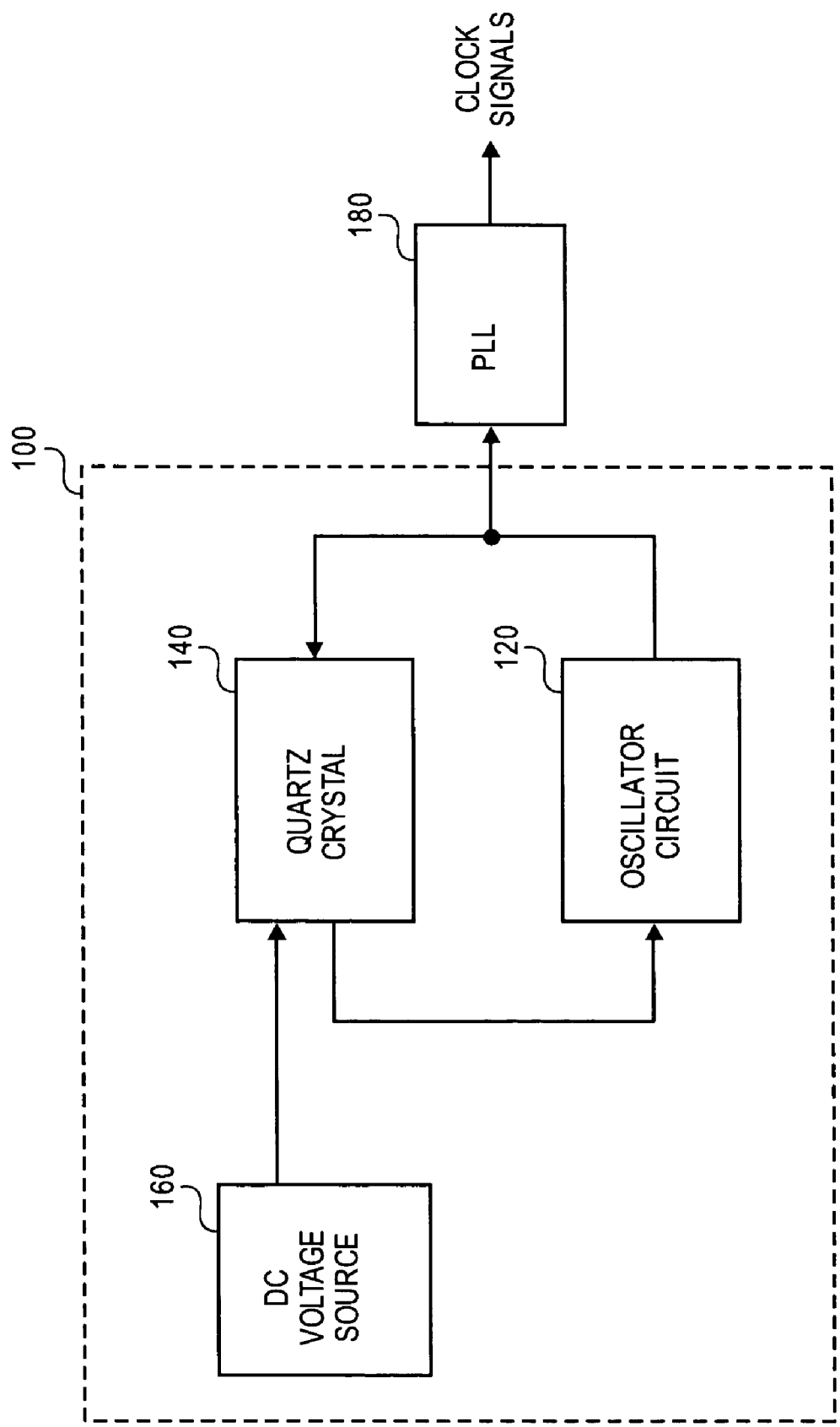
FIG. 1A shows a block diagram of an embodiment of a crystal oscillating system including an oscillator circuit.

FIG. 1A shows an embodiment of a crystal oscillating system 100 that includes an oscillator circuit 120 coupled to a quartz crystal device 140. Quartz crystal device 140 may include a slice of a quartz crystal sandwiched between two electrically conductive plates. Quartz crystal device 140 may include any industry-standard quartz crystal that resonates at a desired frequency. Oscillator circuit 120 serves as an amplifier to amplify the output of quartz crystal device 140. The output of crystal oscillating system 100 may be used as reference clock signals by a phase-locked loop (PLL) 180 to generate clock signals. Crystal oscillating system 100 may receive input from a voltage source 160 that supplies direct-currents (DC) voltages. In one embodiment, oscillator circuit 120 may be fabricated on-die and quartz crystal device 140 may be off-die.

Figure 1B:
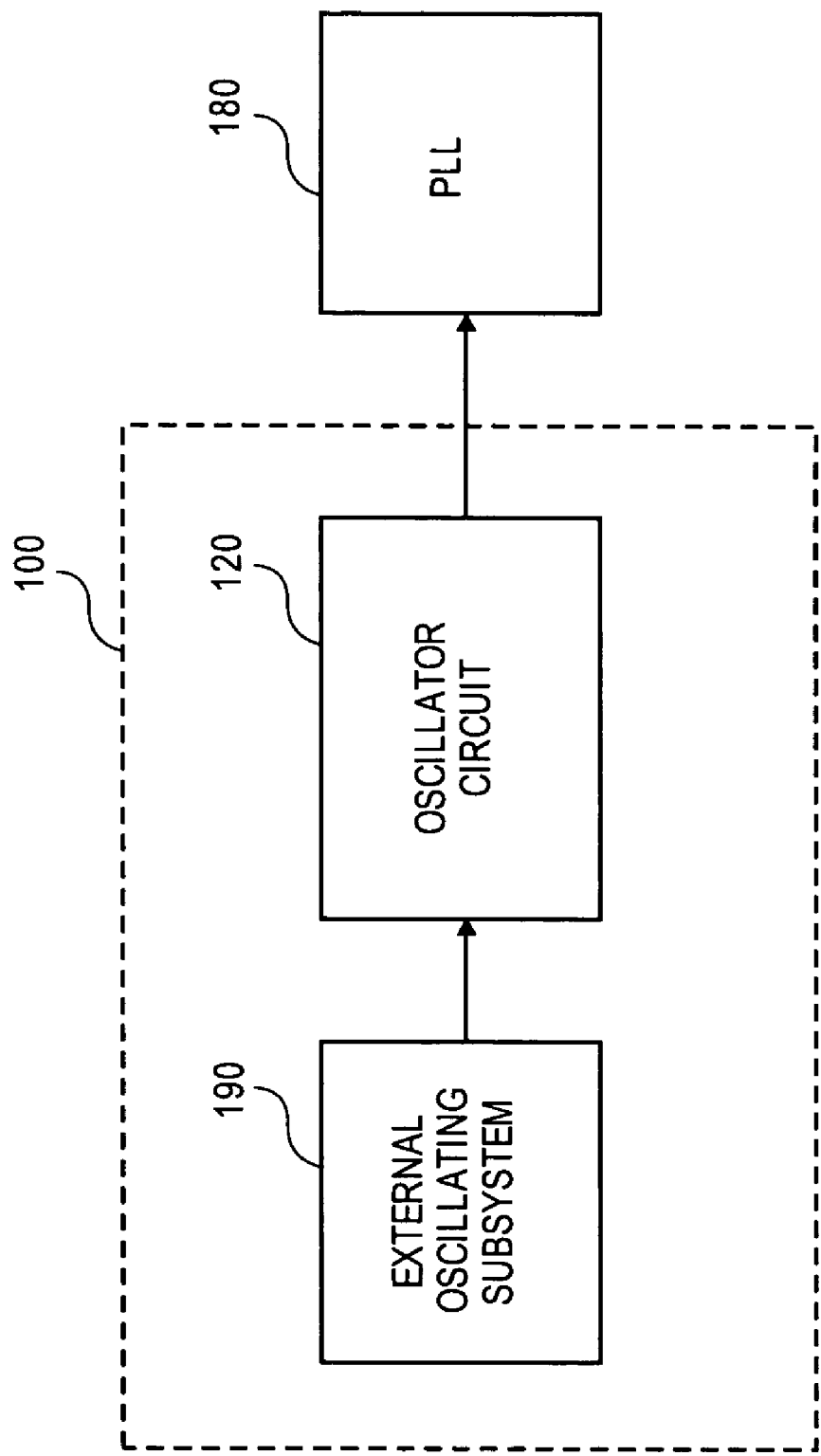
FIG. 1B shows a block diagram of a second embodiment of a crystal oscillating system including the oscillator circuit.

In an alternative embodiment as shown in FIG. 1B, crystal oscillating system 100 includes oscillator circuit 120 and an external oscillating subsystem 190 that has a built-in amplifier. External oscillating subsystem 190 may generate oscillating signals by any suitable electrical, optical, or mechanical means. Oscillator circuit 120 in this embodiment serves as a buffer. The output of external oscillating subsystem 190 is coupled to the input of oscillator circuit 120, and the output of oscillator circuit 120 is coupled to PLL circuit 180. External oscillating subsystem 190 may receive a DC voltage from a DC voltage source. For simplicity of the discussions, the term "oscillator" is used hereinafter to mean an oscillating device such as external oscillating subsystem 190 or quartz crystal device 140. The term "oscillator circuit" is used hereinafter to mean the circuitry (e.g., oscillator circuit 120) coupled to the oscillator for amplification or buffering purposes.

Oscillator circuit 120 may be used in any electronic device, e.g., network processors, local area network interfaces, network bridges or routers, desktop/laptop computers, servers, cellular phones, personal digital assistants, or any other suitable wired or wireless devices.

Figure 2:
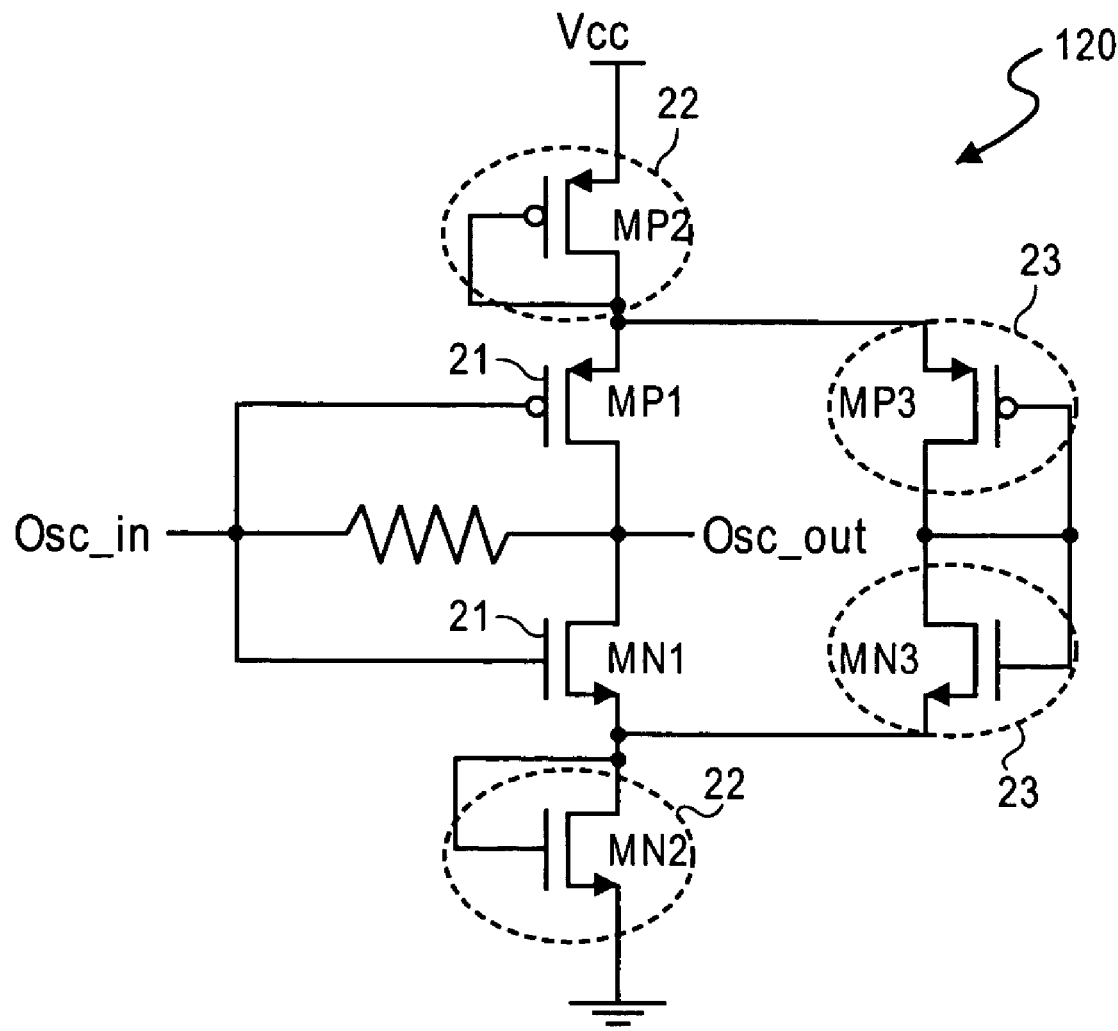
FIG. 2 shows a schematic diagram of an embodiment of the oscillator circuit of FIG. 1A and FIG. 1B.

FIG. 2 shows an embodiment of a schematic diagram of oscillator circuit 120. Oscillator circuit 120 includes a first set of transistors 21, a second set of transistors 22, and a third set of transistors 23. Each set of transistors 21, 22, 23 may include a complementary transistor pair. A complementary transistor pair hereinafter refers to a P-type transistor (e.g., P-type Metal Oxide Semiconductor Field Effect Transistor (MOSFET)) and an N-type transistor (e.g., N-type MOSFET), which may be connected in series, connected in parallel, or not connected to each other. Each transistor in each set of transistors 21, 22, 23 may be fabricated with submicron processes (e.g., 0.13 micron technology) that produce a relatively thin layer of gate-oxide in the transistors. However, the descriptions hereinafter are not limited to submicron transistors and may be applied to transistors or any sizes. The relatively thin layer of gate-oxide may withstand a relatively low gate-to-drain voltage (Vgd) and gate-to-source voltage (Vgs), e.g., 2.5 V. These transistors are referred to hereinafter as low voltage transistors or 2.5V transistors. However, some microelectronic devices operate at a relatively high voltage level (e.g., 3.3 V). Damages may occur at the interface of a 3.3 V device and 2.5 V transistors if Vgd or Vgs of the 2.5 V transistors exceeds a tolerance level of 2.5 V. It is understood, however, the following discussions apply to any transistors that have a tolerance level different from 2.5 V, and also apply to any interface voltage that operates at a voltage higher than the tolerance level of the transistors.

Oscillator circuit 120 is coupled to an oscillator (e.g., quartz crystal device 140 of FIG. 1A) that oscillates in the range of 0-3.3 V. However, each transistor in first set of transistors 21 is a 2.5 V transistor. To reduce oxide-overstress in the transistors, oscillator circuit 120 includes second set of transistors 22 as voltage limiters to limit the voltage level of Vgd and Vgs in each transistor of first set of transistors 21. Oscillator circuit 120 also includes third set of transistors 23 to provide a constant current path for second set of transistors 22.

In one embodiment, first set of transistors 21 may include a P-type transistor (MP1) and an N-type transistor (MN1) serially connected in the form of a push-pull circuit. The push-pull circuit serves as a signal amplifier or a buffer. The gate of MP1 and the gate MN1 receive an input (Osc_in) to oscillator circuit 120. The drain of MP1 and the drain of MN1 are coupled to an output (Osc_out) of oscillator circuit 120. Input Osc_in and output Osc_out are coupled, respectively, to the input end and the output end of an oscillator (e.g., quartz crystal device 140 of FIG. 1A). A resistor 24, typically in the range of 50 k-100 k ohms, connects Osc_in to Osc_out for providing a negative feedback to the input.

In one embodiment, second set of transistors 22 includes a P-type transistor (MP2) and an N-type transistor (MN2). The drain of MP2 is coupled to the source of MP1, and the source of MP2 is coupled to a voltage supply (Vcc). The drain of MN2 is coupled to the source of MN1, and the source of MN2 is coupled to the ground. As available voltage sources in system 100 may be limited, voltage supply Vcc may provide a voltage level substantially equal to a maximum oscillating voltage of Osc_in, which may exceed the tolerance level of 2.5V for Vgs and Vgd. For example, Vcc may provide a voltage level of 3.3V.

Each of MP2 and MN2 may be connected gate-to-drain as a diode. The voltage drop across a diode-connected transistor is approximately the threshold voltage ($V_T$) of the transistor. MP2 has a threshold voltage of $V_{TP2}$ and MN2 has a threshold voltage of $V_{TN2}$. Due to the voltage-limiting quality of the diode-connected MP2 and MN2, the voltage level at the source of MP1 is kept substantially at (Vcc-$V_{TP2}$), and the voltage level at the source of MN2 is kept substantially at $V_{TP2}$. Thus, if MP2 and MN2 are sized such that the $V_{TP2}$ and $V_{TN2}$ are each 0.8V, the sources of MP1 and MN1 will be at (3.3-0.8)=2.5V and 0.8V, respectively. These voltage levels ensure that Vgs and Vgs of MP1 and MN1 do not exceed the 2.5V tolerance level. With input Osc_in oscillating between 3.3V-0.0V, output Osc_out will be kept within 0.8V-2.5V. MP2 and MN2 may alternatively be designed with cascaded diode-connected transistors such that $V_{TP2}$ and $V_{TP2}$ are substantially 0.8V.

In one embodiment, third set of transistors 23 includes a P-type transistor (MP3) and an N-type transistor (MN3) serially connected. Each of MP3 and MN3 may be connected gate-to-drain as a diode. The source of MP3 is coupled to the drain of MP2 and the source of MP1. The source of MN3 is coupled to the source of MN1 and the drain of MN2.

MP3 and MN3 may reduce voltage overshoot and undershoot at output Osc_out. An overshoot or undershoot occurs when Osc_out exceeds the desired range of 0.8V-2.5V. If input Osc_in switches very fast from 0.0V to 3.3V, a fast current surge may occur across MP2 and MP1, causing the voltage at output Osc_out to shoot up to 3.3V before it gradually discharges back down to 0.8V. Similarly, if input Osc_in switches very fast from 3.3V to 0.0V, output Osc_out may temporarily drop to 0.0V before it gradually charges up. MP3 and MN3 reduce the overshoot and undershoot by providing a constant current flow path for MP2 and MN2 even when MP1 and MN1 are switched off. Thus, when MP1 and MN1 are switched quickly, current may flow through the path formed by MP2, MP3, MN3, and MN2. Thus, the current surge through MP2 or MN2 may be improved, and the overshoot or undershoot at Osc_out may be reduced.

Figure 3:
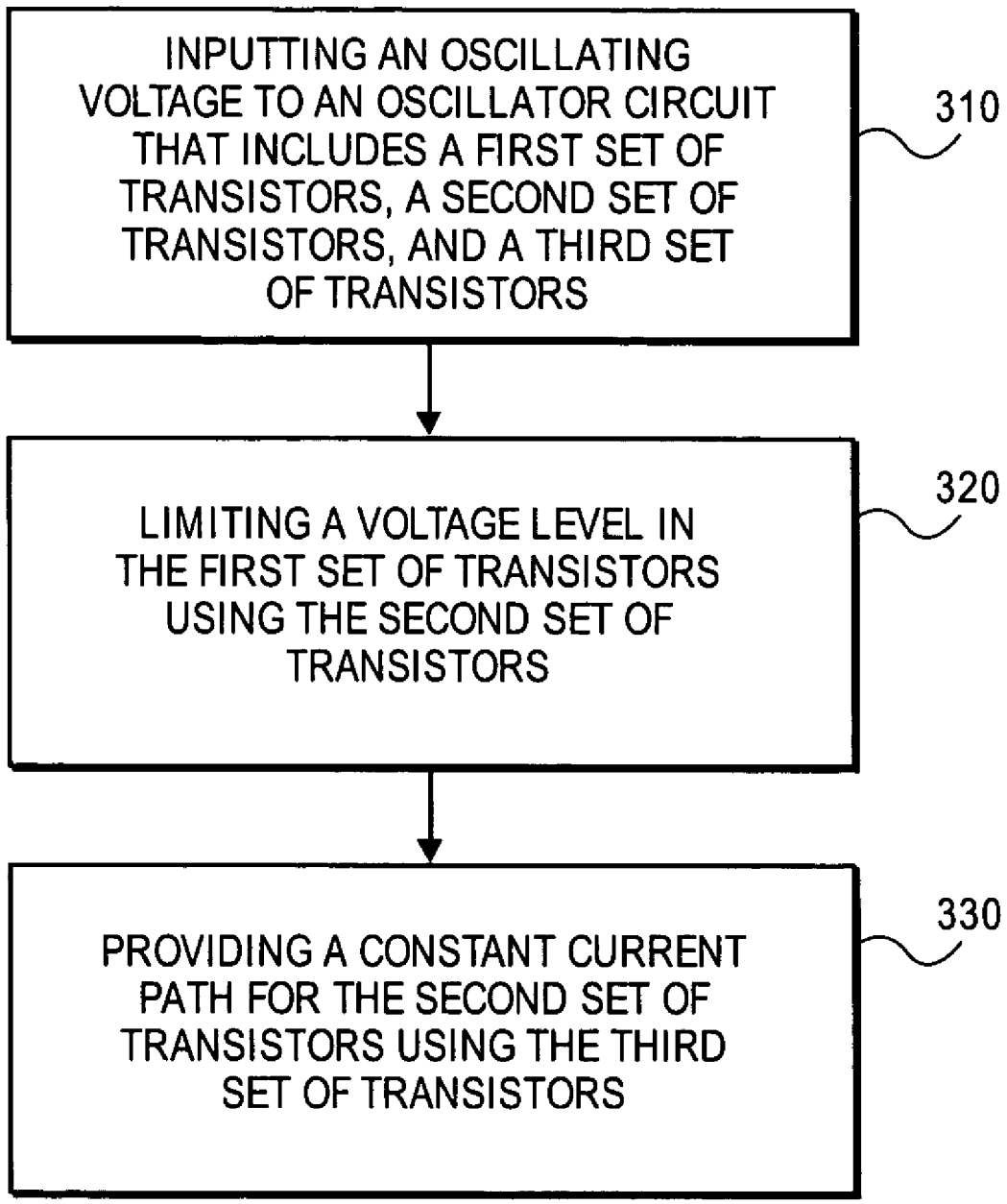
FIG. 3 is a flow chart showing an example of a process of making the oscillator circuit of FIG. 1 and FIG. 1B.

FIG. 3 is a flow chart showing an example of a process of an oscillating circuit (e.g., oscillating circuit 120 of FIG. 2) that include first set of transistors 21, second set of transistors 22, and third set of transistors 23. At block 310, an oscillating voltage is received at the input of oscillator circuit 120. The oscillating voltage may oscillate in a range that exceeds a tolerance voltage level of each transistor of first set of transistors 21. The tolerance voltage level may be the maximum gate-to-source voltage (Vgs) and the maximum gate-to-drain voltage (Vgd) voltages that the transistors 21 may withstand. In an embodiment, the oscillating voltage oscillates in a range that exceeds a tolerance voltage level of each transistor in first set of transistors 21, second set of transistors 22, and third set of transistors 23.

At block 320, second set of transistors 22 is used to limit the voltage level of Vgs and Vgd in first set of transistors 21. Each transistor of second set of transistors 22 may be diode-connected to provide a substantially constant voltage drop of $V_T$ in the conductive path between a voltage supply Vcc and the ground. As a result, the voltage level of Vgs and Vgd is within the tolerance voltage level of each transistor in first set of transistors 21.

At block 330, third set of transistors 23 is used to provide a constant current path for second set of transistors 22, such that voltage overshoot and undershoot at output Osc_out is reduced. The reduction of overshoot and undershoot can be achieved regardless whether each transistor of first set of transistors 21 is switched on or switched off. Thus, the reduction of overshoot and undershoot can be achieved independent of a switching state of each transistor of first set of transistors 21.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense.

What is claimed is:

1. A method comprising:
    inputting an oscillating voltage to an oscillator circuit that includes a first set of transistors, a second set of transistors, and a third set of transistors, wherein the oscillating voltage oscillates in a range exceeding a tolerance voltage level of each transistor of the first set of transistors;
    limiting a voltage level in the first set of transistors using a first plurality of diode-connected transistors in the second set of transistors such that the voltage level is within the tolerance voltage level; and
    providing a constant current path for the second set of transistors using the third set of transistors, independent of a switching state of each transistor of the first set of transistors.

2. The method of claim 1 wherein limiting a voltage level in the first set of transistors comprises:
    limiting the voltage level in a gate-to-source voltage and a gate-to-drain voltage of each transistor of the first set of transistors.

3. The method of claim 1 wherein limiting a voltage level in the first set of transistors further comprises:
    supplying a constant voltage level substantially equal to a maximum level of the input voltage through the source of a P-type transistor of the second set of transistors; and
    coupling the source of an N-type transistor of the second set of transistor to a ground voltage level.

4. The method of claim 1 wherein providing a constant current path for the second set of transistors comprises:
    providing the constant current path using a second plurality of diode-connected transistors in the third set of transistors.

5. The method of claim 4 wherein providing a constant current path for the second set of transistors further comprises:
    providing the constant current path using the third set of transistors which is coupled in parallel to the first set of transistors.

6. An apparatus comprising:
    first set of transistors coupled to an input voltage and an output voltage of an oscillator
    a second set of transistors coupled to the first set of transistors, each transistor of the second set of transistors connected gate-to-source as a diode; and
    a third set of transistors coupled in parallel to the first set of transistors to provide a constant current path for the second set of transistors, independent of a switching state of each transistor of the first set of transistors.

7. The apparatus of claim 6 wherein the first set of transistors comprises:
a first complementary pair of transistors, wherein each transistor of the first complementary pair of transistors couples the gate to the input voltage and couples the drain to the output voltage.

8. The apparatus of claim 6 wherein the second set of transistors comprises:
a second complimentary pair of transistors.

9. The apparatus of claim 6 wherein the second set of transistors further comprises:
a P-type transistor, the source of the P-type transistor being coupled to a voltage supply that provides a voltage level substantially equal to a maximum level of the input voltage; and
an N-type transistor, the source of the N-type transistor being coupled to a ground voltage level.

10. The apparatus of claim 9 wherein the drain of the P-type transistor and the drain of the N-type transistor are coupled to the first set of transistors.

11. The apparatus of claim 6 wherein the third set of transistors comprises:
a third complimentary pair of transistors, each transistor of the third complementary pair of transistors being connected gate-to-drain as a diode.

12. The apparatus of claim 11 wherein the third set of transistors further comprises:
a P-type transistor; and
an N-type transistor, wherein the source of the P-type transistor and the source of the N-type transistor are coupled to the first set of transistors and the second set of transistors.

13. A system comprising:
a quartz crystal; and
an oscillator circuit coupled to the quartz crystal, the oscillator circuit comprising:
a first set of transistors coupled to an input voltage and an output voltage of the quartz crystal;
a second set of transistors coupled to the first set of transistors, each transistor of the second set of transistors connected gate-to-source as a diode; and
a third set of transistors coupled in parallel to the first set of transistors to provide a constant current path for the second set of transistors, independent of a switching state of each transistor of the first set of transistors.

14. The system of claim 13 wherein the first set of transistors comprises:
a first complementary pair of transistors, wherein each transistor of the first complementary pair of transistors couples the gate to the input voltage and couples the drain to the output voltage.

15. The system of claim 13 wherein the second set of transistors comprises:
a second complimentary pair of transistors.

16. The system of claim 13 wherein the second set of transistors further comprises:
a P-type transistor, the source of the P-type transistor being coupled to a voltage supply that provides a voltage level substantially equal to a maximum level of the input voltage; and
an N-type transistor, the source of the N-type transistor being coupled to a ground voltage level.

17. The system of claim 16 wherein the drain of the P-type transistor and the drain of the N-type transistor are coupled to the first set of transistors.

18. The system of claim 13 wherein the third set of transistors comprises:
a third complimentary pair of transistors each transistor of the third complementary pair of transistors being connected gate-to-drain as a diode.

19. The system of claim 18 wherein the third set of transistors further comprises:
a P-type transistor; and
an N-type transistor, wherein the source of the P-type transistor and the source of the N-type transistor are coupled to the first set of transistors and the second set of transistors.

* * * * *